United States Patent [19]

Belisomi

[11] 4,457,021

[45] Jun. 26, 1984

[54] TELEVISION TUNING SYSTEM WITH MEANS TO PREVENT LOSS OF INFORMATION DURING POWER OUTAGES

[75] Inventor: Pietro Belisomi, Pinerolo, Italy

[73] Assignee: Indesit Industria Elettrodomestici Italiana S.p.A., Italy

[21] Appl. No.: 310,846

[22] Filed: Oct. 13, 1981

Related U.S. Application Data

[62] Division of Ser. No. 040,079, May 17, 1979, Pat. No. 4,314,375.

[30] Foreign Application Priority Data

May 22, 1978 [IT] Italy .............................. 68162 A/78

[51] Int. Cl.³ .......................... H04B 1/16; G11C 5/00
[52] U.S. Cl. ................................. 455/186; 455/343; 358/190; 365/229
[58] Field of Search ............... 455/185, 186, 343; 358/190; 365/227–229

[56] References Cited

U.S. PATENT DOCUMENTS

| | | | |
|---|---|---|---|
| 3,859,638 | 1/1975 | Hume, Jr. ........................ | 365/228 |
| 3,980,935 | 9/1976 | Worst ............................... | 365/228 |
| 4,122,359 | 10/1978 | Breikss .......................... | 365/229 |
| 4,137,502 | 1/1979 | Maddaloni ...................... | 455/343 |
| 4,227,257 | 10/1980 | Sato ................................ | 365/229 |
| 4,301,540 | 11/1981 | Sato et al. ...................... | 455/343 |

*Primary Examiner*—Jin F. Ng
*Attorney, Agent, or Firm*—Ostrolenk, Faber, Gerb & Soffen

[57] ABSTRACT

A television tuning system with a circuit for preventing the loss of information during power outages is disclosed. A disable signal is generated in response to the interruption of a mains power supply. In response to the disable signal, a series of fixed signals are applied to at least one of the date and address terminals of a memory containing the information to be preserved. An appropriate signal for preventing the information stored in the memory from being changed during the period in which the disable signal is generated is also applied to the memory.

5 Claims, 7 Drawing Figures

100 # TELEVISION TUNING SYSTEM WITH MEANS TO PREVENT LOSS OF INFORMATION DURING POWER OUTAGES

RELATED APPLICATION

This is a divisional of U.S. patent application Ser. No. 040,079, filed May 17, 1979 now U.S. Pat. No. 4,314,375, issued Feb. 2, 1982.

BACKGROUND OF THE INVENTION

The present invention is directed towards a television tuning system which includes a circuit for preventing the loss of information stored in a memory and used by the television tuning system during its operation during power outages.

Electronic tuning systems are well known in the art. Such systems normally include a memory which stores information concerning the operating parameters of the television such as the frequency of channels which are to be tuned to, desired volume, brightness and color settings, etc. The memory also often stores other information such as the time of day, etc.

It is important to preserve the foregoing information in the case of power outages. This can be done using a permanent external memory (a battery-supplied, low consumption CMOS memory or non-volatile MNOS memory). Nevertheless, it has been shown that part of the data in the memory may be lost during the transient state between the loss of power and the return of the power.

It is a primary object of the present invention to provide a circuit arrangement designed to prevent loss of part of the data in the memory during the transient state between the loss of power and the return of the power.

SUMMARY OF THE INVENTION

In order to achieve the foregoing and other objects of the invention which will be clear from the following description thereof, the present invention is directed towards an apparatus for use with a television receiver, the apparatus comprising:

a power circuit for converting a mains power supply voltage to a reduced voltage which is applied as a power signal to several components of said television receiver, said power circuit generating said reduced voltage shortly after said mains power supply voltage is applied thereto and maintaining said reduced voltage until shortly after said mains power supply voltage is removed therefrom;

a read/write memory for storing information relating to the operating parameters of said television receiver, said memory having data terminals, address terminals, and one or more control terminals for controlling operation of said memory;

a control circuit for controlling said operating parameters of said television receiver as a function of said information stored in said memory and as a function of data signals applied thereto, said control circuit changing the values of said information stored in said memory by applying control signals to said data and address terminals of said memory in response to specific data signal applied to said control circuit;

first means for generating a disable signal responsive to an interruption of said mains power supply voltage, said disable signal being generated before said reduced voltage is cut off in response to the removal of said mains power supply voltage from said power circuit, said disable signal continuing until after said reduced voltage is again generated by said power circuit in response to the reapplication of said mains power supply voltage to said power circuit;

second means responsive to said disable signal for supplying a series of fixed signals to at least one of said data and address terminals of said memory; and third means responsive to said disable signal for applying to at least one of said control terminals of said memory an appropriate signal for preventing said information stored in said memory from being changed during the preiod in which said disable signal is generated.

BRIEF DESCRIPTION OF THE DRAWINGS

The invention will now be described, by way of example only, with reference to the accompanying drawings, in which.

DETAILED DESCRIPTION OF THE PREFERRED EMBODIMENT

Figure 1:
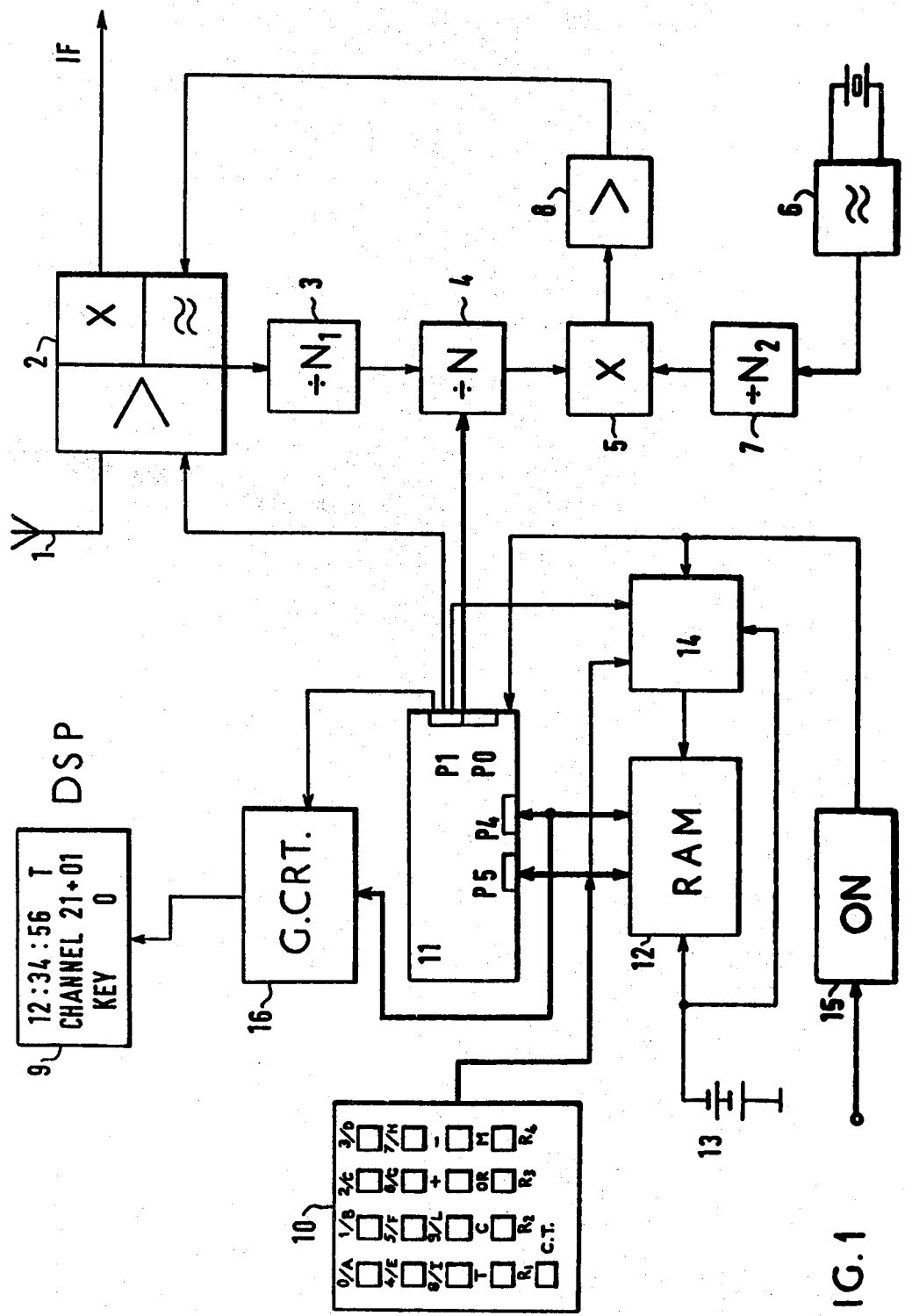
FIG. 1 shows the block diagram of part of a television receiver according to the present invention.

Number 1 in FIG. 1 indicates a receiving aerial connected to varicap-diode tuner 2 which generates a signal converted to intermediate frequency IF at its output. The tuner is the known type and consists essentially of a selective amplifier stage, a mixer circuit and local oscillator circuit.

One output on the local oscillator circuit is connected to a first frequency-divider circuit 3 which divides by a fixed number N1 and whose output is connected to the signal input of a second divider 4 which divides by a variable number N determined by 12-bit signal, which means it can divide by any number from 1 to $2^{12}$.

The output of divider 4 is connected to a first input of phase-frequency comparator circuit 5 to whose second input a reference signal generated by quartz generator 6 is applied via a third frequency-divider circuit 7. The output of comparator circuit 5 is connected to the tuner circuit varicap diode voltage control input via amplifier and filtering circuit 8.

Number 10 indicates a control unit consisting of a keyboard which, besides the control keys not shown, such as the on/off switch and volume, brightness, contrast and color adjustment controls, also contains 10 number keys marked 0 to 9 (or letter keys marked A, B, C, D, E, F, G, H, I, L) and 7 auxiliary keys marked +, −, T, C, OR, M, CT (or +, −, R1, R2, R3, R4, CT).

This control unit is connected to a first group of eight input-output terminals of processing unit or circuit 11 and to the address inputs of memory circuit 12. The said processing unit also has a second set of eight input-output terminals connected to the data input-output terminals of memory circuit 12 and the inputs of character generator circuit 16. This, in turn, is connected to display device 9 (including the kinescope on the set) while a third group of 16 terminals is connected to:

12 programming inputs of 12-bit divider 4;
2 band-switch inputs (U and BIII) of tuner 2;

1 control input of character generator circuit 16; a first input of combiner circuit 14.

Memory circuit 12 has further control terminals connected to the output of combiner circuit 14 which receives a signal from circuit 11 at a second input and a signal from on-detector circuit 15 at a third. Circuit 15 receives a signal from the power mains to which the television set is connected and also has its output connected to a RESET input of circuit 11.

Memory 12 and the low-current-absorption CMOS combiner circuit 14 are connected to a local battery supply source 13. The circuit operates as follows:

Circuits 3, 4, 5 and 8, together with the varicap-diode-controlled local oscillator (VCO) in tuner 2, form a phase lock loop controlled by the reference signal generated by quartz generator 6 and divided by divider 7 according to the known technique.

The function of divider circuit 3 is to reduce the frequencies involved to more easily processable levels while programmable divider 4 enables locking to be affected for a number of local oscillator frequencies, that is, it acts as a frequency synthesizer circuit.

In fact, after selecting division number N for divider circuit 4, phase-frequency comparator 5 supplies circuit 2, via amplifier 8, with voltage for obtaining the following condition:

$$\frac{f6}{N_2} = \frac{f2}{N_1 \cdot N} \text{ or} \tag{1}$$

$$f2 = P \cdot N \text{ in which} \tag{2}$$

in which f2 is the oscillation frequency of the local oscillator circuit in tuner 2, f6 is the oscillation frequency of reference oscillator circuit 6, $N_2$, $N_1$ and N are the division ratios of dividers 3, 6 and 4 respectively, while $P = f6\ N_1/N_2$ indicates the system pitch, that is, the amount by which local oscillator frequency varies alongside variations in number N.

The receiver must be capable of tuning into broadcasting stations of a given transmission standard, e.g. C.C.I.R./B-G, with channeling as agreed at the 1961 European Radio Broadcasting Conference in Stockholm, that is, broadcasting stations with one-step spacing between adjacent 7 MHz channels on the I and III (VHF) bands and 8 MHz channels on the IV and V (UHF) bands with a 5 MHz video signal band width. These broadcasting stations fall within television channels 2 and 69 (video carrier frequencies 48.25 and 855.25 MHz respectively) with 38.9 MHz intermediate frequency IF. This means the local oscillator on the tuner must be capable of generating frequencies ranging from 87.15 to 894.15 MHz. A 0.25 MHz pitch was selected which, according to equation 2 gives the following values for the two above mentioned channels:

$$N_{min} = \frac{87.15}{0.25} \quad \frac{87}{0.25} = 348$$

$$N_{max} = \frac{894.15}{0.25} \quad \frac{894.25}{0.25} = 3577$$

By varying number N between these maximum and minimum values, any television channel on the VHF and UHF bands can be tuned into with a maximum error of 125 KHz.

Not all of this frequency range can be utilized so the tuner is provided with two band switch inputs U (UHF/VHF) and B (BIII/BI) to ensure only effective bands are covered. Divider 3 is a high-speed ECL type which divides by 64 (SP 8750). Divider 4 is a programmable TTL which can operate up to frequencies of about 15 MHz ($3 \times$ SN74LS191). Circuits 5, 6 and 7 consist of an SP8760 integrated circuit with 250 KHz frequency quartz and $N_2 = 64$ division ratio so that comparator circuit 5 operates at 3906.25 Hz frequency which corresponds to a quarter of line frequency. The function of amplifier and filter 8 is to adapt the output level of comparator 5 (max. 5 V) to the requirements of tuner 2 (max. 30 V) and provide the best possible filtering and lock speed conditions.

Circuit 11, which consists of a microprocessor unit, is designed to generate, among other things, N numbers and bandswitch signals for tuning into specific television broadcasting stations on the basis of data relative to the signals being tuned into supplied by the user from control keyboard 10. The said circuit 11 is also capable of supplying or receiving signals from memory 12 and sending signals to character generating circuit 16.

Number N is calculated using the following equation:

$$N = (K \cdot F + C) \cdot 4 + S \tag{3}$$

The operations shown are performed by means of a series of elementary operations by an arithmetical-logic unit (ALU) on the basis of instructions contained in a (ROM) program memory contained in the processing circuit 11 and performed, in this case, using an F8 microprocessor. Constant correction C and factor F depend on the band selected; K is the channel number according to the said standard and the S variable can be changed for performing fine tuning corrections.

If channel number K is changed, we only get the frequencies corresponding to standard channels with a pitch equal to F (8 MHz for UHF and 7 for VHF), whereas one-unit variation of S causes frequency shifts of 0.25 MHz.

With appropriate control from the keyboard, various modes are possible for tuning into a given broadcasting station partly using known methods.

Whenever any one of the keys is pressed, processing unit 11 sends an ISO-coded 48-character sequence to character generator 16 which is displayed on the television screen in a three 16-character line arrangement.

This sequence always includes a time indication (hours, minutes, seconds). The remainder consists partly of fixed data from the ROM program memory (e.g. "CHANNEL" and "KEY" shown in FIG. 1) and partly of variable data depending on the controls activated by the user and the situation resulting from them which is memorized in a memory buffer inside unit 11 (e.g. the letter T indicating operation mode in the top right-hand corner of FIG. 1; figures 21-01, also in FIG. 1 following the "CHANNEL" indication which show the channel number and tuning correction).

The time indication is corrected automatically each second even if no key is pressed in the meantime.

When one of the "T", "C", "OR" or "M" keys is pressed, the corresponding operation mode is set and memorized in the memory buffer of processing unit 11. At the same time, one or more question marks are entered into the buffer at appropriate points to guide the user to the next control operation. The content of the buffer is then transmitted, of course, to the character generator and displayed on the television screen.

A few examples will now be given to give a clearer idea of this point.

When key "T" is pressed, the display shows:
00:MM:SS T
KEY ?

In this way, the user is informed that he has selected mode "T" (memory selection) and that the device expects a number key to be pressed (that is, an emitter memory key number). N.B.: 00:MM:SS in the above example stands for the time indication (hours, minutes, seconds).

When key "C" is pressed, the display shows:
00:MM:SS C
CHANNEL ??

In this way, the user is informed that he was selected mode "C" (direct selection) and that the device expects two number keys to be pressed (required channel number). If the number formulated by these two keys corresponds to a channel in the standard, the said number will be displayed in place of the two question marks beside the "CHANNEL" indication. If the channel number does not correspond to one in the standard, the display shows:
00:MM:SS C
CHANNEL ??
88

In this way, the user is informed that the control set (channel 88 not covered by the C.C.I.R. standard) has not been performed and that the device is awaiting further instructions. When key "OR" is pressed (causing the generation of a time reset control signal which is applied to processing unit 11), the display shows:
??:??:?? T
CHANNEL 21+01
KEY 0 OR This tells the user that the television set is still set to mode "T", that it is tuned to channel 21 with a tuning correction equivalent to one frequency shift over 250 KHz, memorized on key 0, and that the device expects six number keys to be pressed one after the other corresponding to the hours, minutes and seconds the clock is to be reset to. As the six keys are pressed, the corresponding number is displayed in place of the "OR" indication and pairs of numbers replace the "??" corresponding to the hours, minutes and seconds, provided the numbers are acceptable.

In fact, the device checks the set numbers and, if the hour number is over 23 or the number corresponding to the tens of the minutes or seconds over 5, the two numbers (hours, minutes or seconds) are rejected and the two question marks are left displayed to inform the user that the device is waiting for another pair of acceptable numbers to be set. After the operation has been performed, the clock starts counting from the time set by the user.

The device is so designed that, following a power cut, a series of zeros is displayed for the hours, minutes and seconds and the clock remains in this condition to inform the user that the power supply has temporarily been cut off.

When the "M" key is pressed, the display shows:
00:MM:SS T
CHANNEL 21+01
KEY #? M This tells the user that the television is still set to "T" mode, that it is tuned to channel 21 with +01 tuning and that the set is waiting for a number key to be pressed to memorize the channel tuned into. If key "0" is pressed, for example, the display shown in FIG. 1 appears and the channel is associated with key "0" for memory selection. If key "+" is pressed, the display shows:
00:MM:SS T
CHANNEL 21+02
KEY 0

This tells the user that the television is still set to "T" mode and that excess tuning corrections are being made, that is, towards the audio carrier of the received video signal. Circuit 11 supplies the programmable divider circuit, with a suitable modified number N and this tuning condition is automatically associated in the memory with key "0". Operation is similar when key "−" is pressed except for the direction of the tuning adjustment (towards the video). Once nominal tuning is obtained, the "+" sign and the following number are cancelled while, for more defective tuning conditions, the "−" sign appears followed by the number of displacements made. The system is so designed to limit maximum variations to the −16 to +15 range. Of course, the tuning correction can be made in the same way even with the set in the direct selection mode (mode "C").

In this case though, the operation does not involve automatic memorization. For the channel and obtained tuning condition to be memorized, the "M" key must be pressed, followed by a number key.

When the "CT" (keyboard switch) key is pressed, the display shows:
00:MM:SS *T*
CHANNEL 21+01
KEY 0

This tells the user ("*" beside the mode indication) that the device is set to perform a further series of functions corresponding to the second indication on each key. Following this operation, the processing circuit 11 supplies character generator 16 with a switch signal to switch the color of the writing on the screen or the background color so as to make it even more clear to the user that the controls available from that time on correspond to second key indications (this applies, of course, to color television sets).

If one of the keys marked "A" to "L" is pressed, the display shows:
00:MM:SS *C*
CHANNEL A This tells the user that the television is set to mode "C" but, in this case, channels can be selected directly according to the Italian standard by pressing a single key with indication of the received channel.

When one of keys R1, R2, R3 or R4 is pressed, the display shows, for example:
00:MM:SS *1*
CHANNEL 21+01
KEY 0 RA This tells the user that the set is performing an automatic scanning operation, for example type 1, or is scanning all the channels in the memory.

Scanning progresses automatically every two seconds with indications in each case of the key number and associated channel. At the same time, processing circuit 11 generates the relative N numbers for receiving the channel. Scanning stops when any other key is pressed. If the "+" or "−" key is pressed, the device remains set for manual advance or reversing (every time the "+" key is pressed, the key number is increased and decreased every time the "−" key is pressed). If the "CT" key is pressed, the device switches back to the first keyboard and awaits further instructions, in particular, tuning correction or memorization controls. Similarly, if key R2 is pressed after selecting the second keyboard using the "CT" key, this starts a type 2 scanning operation of all the standard channels (one switch per second). This can be stopped in the same way as type 1 scanning.

If key R3 is pressed, this starts a continuous scanning operation of the frequency band in 1 MHz steps, that is, 4 fine tuning switches per second, to detect any transmitters operating over non-standard frequencies. The same type of scanning operation, though at reduced speed (one switch every two seconds), is started pressing key R4.

The "KEY" indication is not displayed during type 2, 3 and 4 scanning operations.

Display or omission of the fixed "CHANNEL" and "KEY" indications depends on whether the indication or blank sectors of the ROM memory are utilized. Circuit 11 also comprises a timer which, 15 seconds after the last key has been activated, supplies a switch signal (bit 6 port 1) to character generator 16 which reduces the display to one line and also halves the height of the characters (7 instead of 14 television lines) to reduce disturbance to the picture. This switch signal, of course, is not supplied during automatic scanning or clock adjustment.

To prevent memorized data being lost during a power outage provision is made for a battery-supplied outside RAM memory 12. Whenever a memorization operation is performed, processing unit 11 updates the information in the RAM memory. When power supply returns to normal, the same unit 11 calls up the data memorized in the RAM memory.

"ON RESET" circuit 15 and combiner circuit 14 protect the data contained in RAM memory 12 during transient states between power supply failure and restoration.

Figure 2:
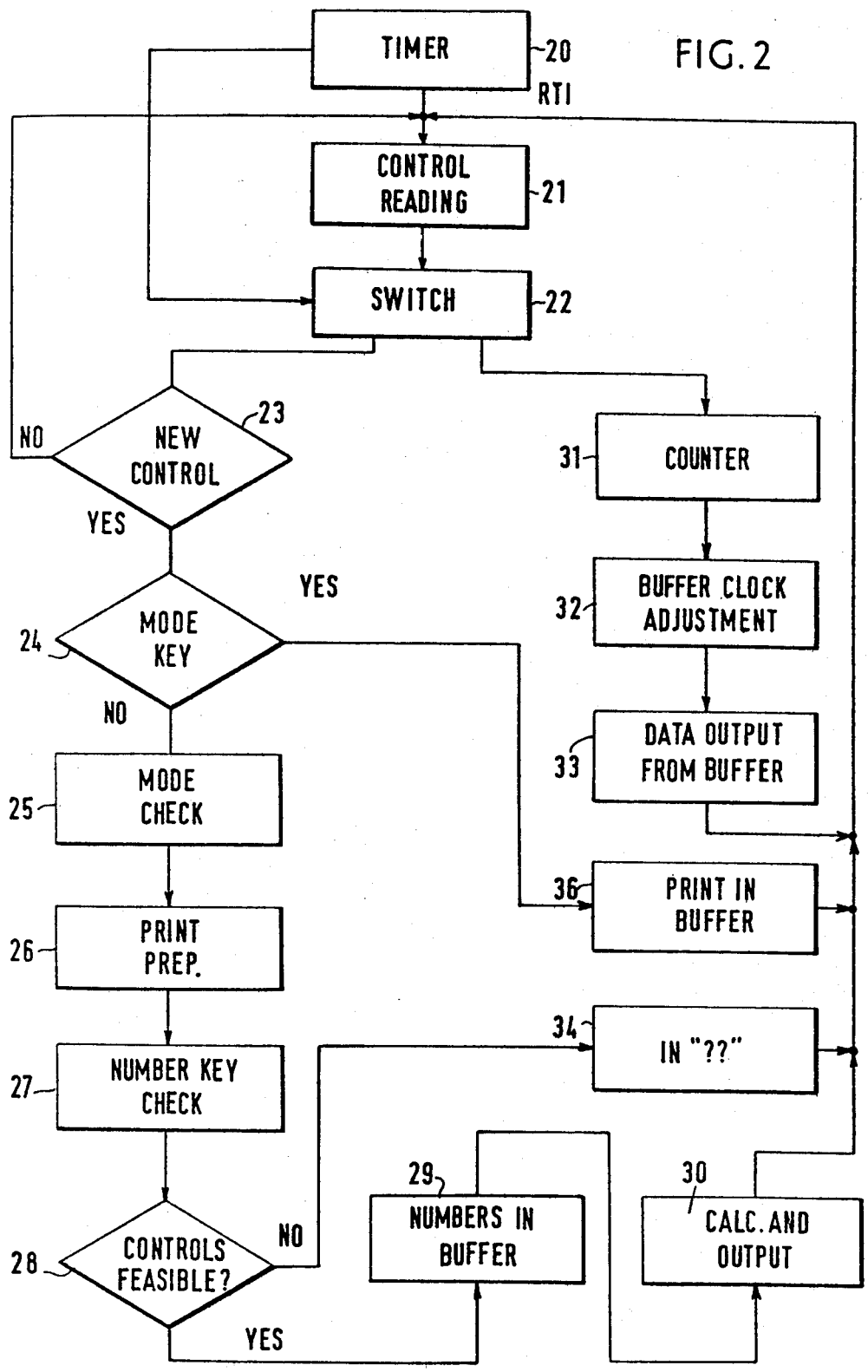
FIGS. 2, 3 and 4 show block diagrams of elementary logic functions performed by the circuits on the device according to the present invention.
Figure 3:
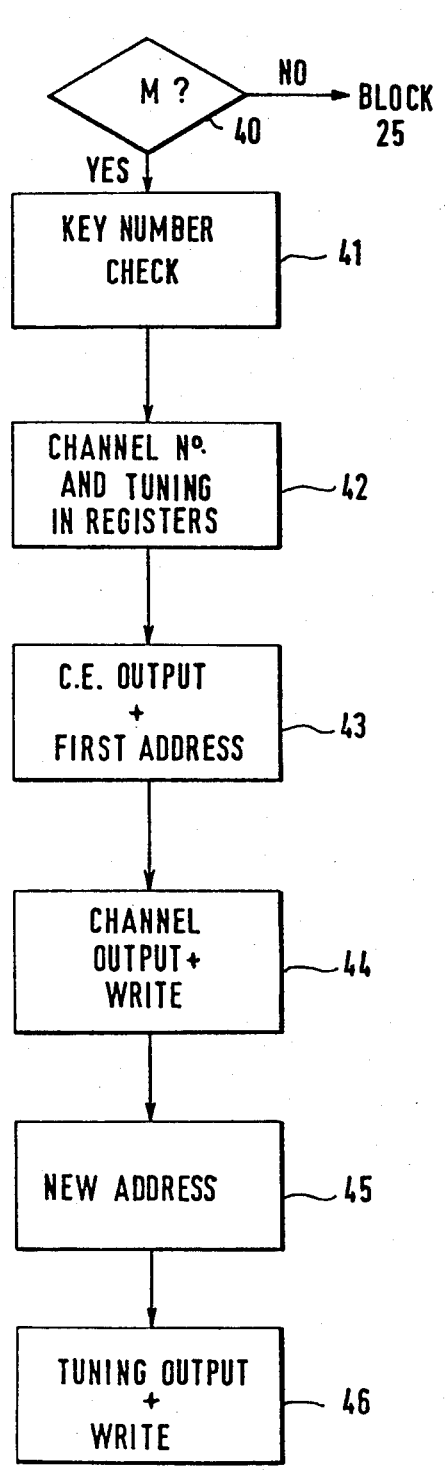
Figure 4:
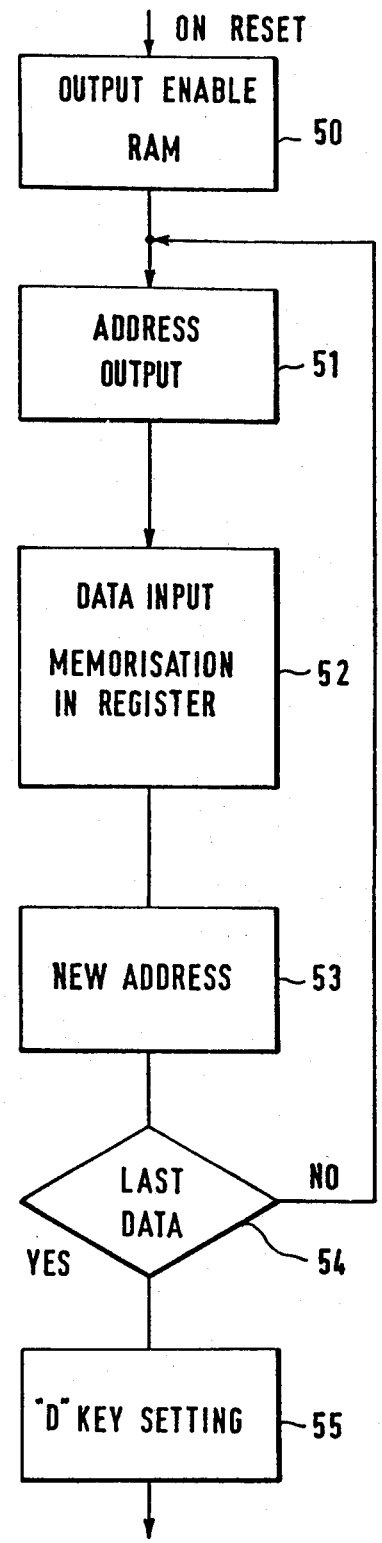

Operation of processing unit 11 is shown more clearly in the elementary logic function block diagrams in FIGS. 2, 3 and 4.

FIG. 2 shows operation mode and relative indication selection;

FIG. 3 shows updating of the data in outside RAM memory 12;

FIG. 4 shows data being called up from the outside RAM memory following restoration of the power supply.

Number 20 in FIG. 2 indicates a timer which sets a switch circuit, 22, with its output usually towards block 23 and supplies an RTI signal to block 21 which reads the controls set on the keyboard. Block 21, via switch 22, supplies a signal to block 23 which ascertains the presence of a new order. The "NO" output supplies the RTI signal which reactivates reading block 21 while the "YES" output activates block 24 which ascertains whether the key pressed was a mode key. The "NO" output of block 24 activates block 25 which examines the operation mode selected and, in turn, activates block 26 which, depending on the mode chosen, combines and supplies the indication sequence to the character generator for display. Block 26 then activates block 27 which examines the number keys pressed and activates block 28 which ascertains whether the corresponding order is feasible.

The "NO" output of the block 28 (control not feasible, e.g. the number does not correspond to a standard number channel) activates a following block 34 which inserts question marks at appropriate points in the buffer to inform the user that the control is not feasible and transmits them to character generator 16 (FIG. 1). Block 34 then supplies an RTI signal to block 21 which reads the keyboard once more awaiting further instructions.

The "YES" output of block 28 activates block 29 which sends the channel or key numbers to the buffer, usually the numbers of the order received, transmits the numbers to the character generator and, finally, activates block 30 which calculates number N according to equation (3) and sends this number to programmable divider 4 (FIG. 1) to obtain the required tuning. Finally, block 30 supplies the RTI signal to block 21.

The "YES" output of block 24 activates block 36 which inserts the indications and question marks in the buffer and transmits them to the character generator (as described already). Block 36 then supplies block 21 with the RTI signal. After a set length of time (about 4 milliseconds), depending on circuit 20, switch 22 positions itself with its output towards count circuit 31 which, after a set number of pulses (about 250) per second, supplies a signal to block 32 which updates the clock numbers in the buffer and activates block 33 which sends the data contained in the buffer to the character generator and then supplies an RTI signal to block 21.

Number 40 in FIG. 3 indicates a block for ascertaining whether the operation selected involves memorization. The "NO" output supplies a signal which activates block 25 (FIG. 2) while the "YES" output activates in turn:

block 41, which examines the number of the key pressed;

block 42, which memorizes the channel number and tuning in the registers corresponding to the said key;

block 43, which supplies an enabling signal (C.E.) and a first address for the outside memory circuit 12;

block 44, which supplies the channel number data and a memorizing pulse (WRITE) to the same circuit 12;

block 45, which supplies the new address;

block 46, which supplies the tuning data and memorizing pulse to memory 12.

Number 50 in FIG. 4 indicates a block which, following an "ON RESET" signal from circuit 15 in FIG. 1, supplies an output enabling (O.E.) signal to memory 12 as well as a signal for activating in turn:

block 51, which supplies the address to memory 12;

block 52, which reads the data from memory 12 and loads it into the registers in unit 11 of FIG. 1;

block 53, which calculates the new address;

block 54, which ascertains whether all the cells in memory 12 have been read. The "NO" output of block 54 supplies a signal for activating block 51 once more. The "YES" output activates block 55 which sets to mode "T" (memory selection) and key "0" and supplies an activation signal to block 25 of FIG. 2.

For further information concerning operation of the device, refer to Italian patent application No. 69950-A/77, noted above, which describes a device partly similar to the present one. In the actual device, a Fairchild F8 microprocessor unit was chosen for processing unit 11 which comprises a 3850 C.P.U., 3861 P.I.O., 3853 S.M.I. and two PROM F93448 memories. Each of the said two PROM memories comprises a connection matrix with a 512×8 format, input and address decoding circuits and output buffer circuits.

Each connection may be open or closed and represents permanent elementary data (bit) 1 or 0 respectively. Each group of 8 connections, addressed by one of the 512 address input combinations, represents an elementary 8-bit instruction or word (byte). By applying all the possible address combinations at the input, all the data contained in the ROM can be obtained at the output in word form.

These connections are described in the following tables for the circuit. The left-hand columns show the addresses, using hexadecimal notation, and the right-hand ones the connections of the corresponding memory cell. Number 1 refers to an open connection with logic 1 at the output while 0 refers to a closed connection.

As each memory cell consists of 8 connections, this means it can be represented with a combination of 8 binary figures. For the sake of simplicity, the hexadecimal system was used on the following tables, so that, for example, EA for base 16, which corresponds to 11101100 of base 2, indicates that the corresponding memory cell has connections 1, 2, 3, 5 and 6 open and the rest closed.

TABLE 1

| ADDRESS | CODE | ADDRESS | CODE |
|---|---|---|---|
| 0000 | 70 | 000C | 04 |
| 0001 | B5 | 000D | 6A |
| 0002 | B1 | 000E | 7A |
| 0003 | B6 | 000F | 5C |
| 0004 | BE | 0010 | 6D |
| 0005 | BF | 0011 | 5C |
| 0006 | B4 | 0012 | 7F |
| 0007 | 65 | 0013 | 58 |
| 0008 | 6F | 0014 | 18 |
| 0009 | 5E | 0015 | 07 |
| 000A | 8F | 0016 | 67 |
| 000B | FE | 0017 | 5C |
| 0018 | 66 | 0031 | 70 |
| 0019 | 5E | 0032 | BD |
| 001A | 8F | 0033 | 5B |
| 001B | FE | 0034 | B5 |
| 001C | 20 | 0035 | 90 |
| 001D | 10 | 0036 | 12 |
| 001E | 0B | 0037 | 1B |
| 001F | 24 | 0038 | A5 |
| 0020 | 90 | 0039 | EB |
| 0021 | B5 | 003A | 84 |
| 0022 | A4 | 003B | FD |
| 0023 | 5C | 003C | 59 |
| 0024 | 0A | 003D | 21 |
| 0025 | 1F | 003E | 10 |
| 0026 | 25 | 003F | 49 |
| 0027 | 28 | 0040 | 94 |
| 0028 | 94 | 0041 | 19 |
| 0029 | F5 | 0042 | EB |
| 002A | 7C | 0043 | 5B |
| 002B | 06 | 0044 | 91 |
| 002C | 15 | 0045 | F3 |
| 002D | 5A | 0046 | 73 |
| 002E | B1 | 0047 | BE |
| 002F | 72 | 0048 | 1A |
| 0030 | BC | 0049 | 67 |
| 004A | 4B | 0063 | 03 |
| 004B | 21 | 0064 | 66 |
| 004C | 1F | 0065 | 6B |
| 004D | 59 | 0066 | 5C |
| 004E | 6F | 0067 | 69 |
| 004F | 25 | 0068 | 5C |
| 0050 | 09 | 0069 | 29 |
| 0051 | 81 | 006A | 02 |
| 0052 | 1A | 006B | 06 |
| 0053 | 25 | 006C | 47 |
| 0054 | 0F | 006D | 56 |
| 0055 | 81 | 006E | 49 |
| 0056 | 32 | 006F | 57 |
| 0057 | 29 | 0070 | 5E |
| 0058 | 02 | 0071 | 46 |
| 0059 | 03 | 0072 | 5D |
| 005A | 1A | 0073 | E8 |
| 005B | EB | 0074 | 84 |
| 005C | 5B | 0075 | 1D |

TABLE 1-continued

| ADDRESS | CODE | ADDRESS | CODE |
|---|---|---|---|
| 005D | 21 | 0076 | 66 |
| 005E | 10 | 0077 | 6A |
| 005F | 20 | 0078 | 00 |
| 0060 | FA | 0079 | CC |
| 0061 | 94 | 007A | 91 |
| 0062 | 02 | 007B | 17 |
| 007C | 7F | 0095 | 25 |
| 007D | 5C | 0096 | 0D |
| 007E | 6E | 0097 | 84 |
| 007F | 03 | 0098 | 0A |
| 0080 | 5D | 0099 | 81 |
| 0081 | 5C | 009A | 23 |
| 0082 | 67 | 009B | 25 |
| 0083 | 5E | 009C | 0F |
| 0084 | 8F | 009D | 84 |
| 0085 | FE | 009E | 40 |
| 0086 | 90 | 009F | 29 |
| 0087 | E2 | 00A0 | 01 |
| 0088 | 25 | 00A1 | 3B |
| 0089 | 0B | 00A2 | 67 |
| 008A | 81 | 00A3 | 6C |
| 008B | 51 | 00A4 | 03 |
| 008C | 06 | 00A5 | 5C |
| 008D | 03 | 00A6 | 7D |
| 008E | 5E | 00A7 | 66 |
| 008F | 5D | 00A8 | 6A |
| 0090 | 7F | 00A9 | 06 |
| 0091 | 5E | 00AA | 55 |
| 0092 | 02 | 00AB | 20 |
| 0093 | 67 | 00AC | 10 |
| 0094 | 6F | 00AD | 52 |
| 00AE | 20 | 00C7 | E4 |
| 00AF | D3 | 00C8 | 5C |
| 00B0 | 5C | 00C9 | 67 |
| 00B1 | 47 | 00CA | 6C |
| 00B2 | E8 | 00CB | 47 |
| 00B3 | 94 | 00CC | 5C |
| 00B4 | 03 | 00CD | E6 |
| 00B5 | 57 | 00CE | 84 |
| 00B6 | 56 | 00CF | 9A |
| 00B7 | 46 | 00D0 | 47 |
| 00B8 | 15 | 00D1 | 13 |
| 00B9 | C7 | 00D2 | 24 |
| 00BA | 51 | 00D3 | 10 |
| 00BB | 90 | 00D4 | 0B |
| 00BC | 1D | 00D5 | 4D |
| 00BD | 55 | 00D6 | 51 |
| 00BE | 03 | 00D7 | 4C |
| 00BF | 5E | 00D8 | 52 |
| 00C0 | 8F | 00D9 | 29 |
| 00C1 | FE | 00DA | 01 |
| 00C2 | 66 | 00DB | 84 |
| 00C3 | 5E | 00DC | 90 |
| 00C4 | 5C | 00DD | 4A |
| 00C5 | 6A | 00DE | 66 |
| 00C6 | 20 | 00DF | 4C |
| 00E0 | E8 | 00F9 | 13 |
| 00E1 | 84 | 00FA | B5 |
| 00E2 | 35 | 00FB | 05 |
| 00E3 | 67 | 00FC | 24 |
| 00E4 | 20 | 00FD | 10 |
| 00E5 | DD | 00FE | 0B |
| 00E6 | 5C | 00FF | 72 |
| 00E7 | 6B | 0100 | 59 |
| 00E8 | 4D | 0101 | 41 |
| 00E9 | CE | 0102 | 5D |
| 00EA | 1F | 0103 | B4 |
| 00EB | 84 | 0104 | 01 |
| 00EC | 2B | 0105 | EA |
| 00ED | 20 | 0106 | B5 |
| 00EE | F3 | 0107 | EA |
| 00EF | 5D | 0108 | B5 |
| 00F0 | 47 | 0109 | 1F |
| 00F1 | 5C | 010A | B5 |
| 00F2 | E8 | 010B | 05 |
| 00F3 | 84 | 010C | 42 |
| 00F4 | 31 | 010D | 5C |
| 00F5 | A1 | 010E | 39 |
| 00F6 | EA | 010F | 94 |
| 00F7 | B1 | 0110 | F3 |
| 00F8 | 4C | 0111 | 70 |

TABLE 1-continued

| ADDRESS | CODE | ADDRESS | CODE |
| --- | --- | --- | --- |
|  |  | 0112 | B4 |
| 0113 | B5 | 012C | 52 |
| 0114 | A1 | 012D | 6B |
| 0115 | EA | 012E | 4E |
| 0116 | B1 | 012F | C8 |
| 0117 | 70 | 0130 | 81 |
| 0118 | 57 | 0131 | 55 |
| 0119 | 45 | 0132 | 6C |
| 011A | 06 | 0133 | 70 |
| 011B | 03 | 0134 | CC |
| 011C | 67 | 0135 | 81 |
| 011D | 6F | 0136 | BC |
| 011E | 5E | 0137 | 70 |
| 011F | 5C | 0138 | 57 |
| 0120 | 6C | 0139 | 90 |
| 0121 | 4C | 013A | 4A |
| 0122 | E8 | 013B | 49 |
| 0123 | 94 | 013C | 23 |
| 0124 | 60 | 013D | 0E |
| 0125 | 90 | 013E | 94 |
| 0126 | 5B | 013F | 1E |
| 0127 | 13 | 0140 | 20 |
| 0128 | 18 | 0141 | E2 |
| 0129 | 24 | 0142 | 5E |
| 012A | 16 | 0143 | 20 |
| 012B | C2 | 0144 | DF |
| 0145 | 5C | 015E | E8 |
| 0146 | 6B | 015F | 84 |
| 0147 | 4C | 0160 | 21 |
| 0148 | C8 | 0161 | 46 |
| 0149 | 91 | 0162 | 25 |
| 014A | 04 | 0163 | 05 |
| 014B | 03 | 0164 | 91 |
| 014C | 5D | 0165 | 0C |
| 014D | 5C | 0166 | 00 |
| 014E | 65 | 0167 | 24 |
| 014F | 68 | 0168 | 03 |
| 0150 | 4A | 0169 | 04 |
| 0151 | 04 | 016A | 24 |
| 0152 | 7F | 016B | 65 |
| 0153 | 5D | 016C | 0B |
| 0154 | 5C | 016D | 46 |
| 0155 | 6B | 016E | 5D |
| 0156 | 5D | 016F | 47 |
| 0157 | 5C | 0170 | 5C |
| 0158 | 6E | 0171 | 7F |
| 0159 | 5D | 0172 | 57 |
| 015A | 5D | 0173 | 68 |
| 015B | 90 | 0174 | 4D |
| 015C | 25 | 0175 | 15 |
| 015D | 46 | 0176 | CC |
| 0177 | 25 | 0190 | 53 |
| 0178 | 23 | 0191 | 41 |
| 0179 | 91 | 0192 | 05 |
| 017A | D4 | 0193 | 25 |
| 017B | 90 | 0194 | 01 |
| 017C | 05 | 0195 | 81 |
| 017D | 7F | 0196 | E7 |
| 017E | 66 | 0197 | 25 |
| 017F | 5E | 0198 | 79 |
| 0180 | 5C | 0199 | 91 |
| 0181 | 29 | 019A | E3 |
| 0182 | 02 | 019B | F8 |
| 0183 | 06 | 019C | 25 |
| 0184 | 67 | 019D | 09 |
| 0185 | 6B | 019E | 91 |
| 0186 | 03 | 019F | DE |
| 0187 | 5E | 01A0 | 70 |
| 0188 | 8F | 01A1 | CE |
| 0189 | FE | 01A2 | 91 |
| 018A | 66 | 01A3 | 04 |
| 018B | 5E | 01A4 | 03 |
| 018C | 5D | 01A5 | 5D |
| 018D | 67 | 01A6 | 5E |
| 018E | 70 | 01A7 | 66 |
| 018F | 50 | 01A8 | 41 |
| 01A9 | 25 | 01C3 | C9 |
| 01AA | 69 | 01C4 | 51 |
| 01AB | 81 | 01C5 | 25 |
| 01AC | 0B | 01C6 | 14 |
| 01AD | F8 | 01C7 | 91 |

TABLE 1-continued

| ADDRESS | CODE | ADDRESS | CODE |
| --- | --- | --- | --- |
| 01AE | 2A | 01C8 | 4A |
| 01AF | 03 | 01C9 | 13 |
| 01B0 | E0 |  |  |
| 01B1 | 8E | 01CA | C1 |
| 01B2 | 24 | 01CB | 13 |
| 01B3 | 02 | 01CC | C1 |
| 01B4 | 51 | 01CD | 59 |
| 01B5 | 16 | 01CE | 01 |
| 01B6 | 53 | 01CF | 25 |
| 01B7 | 41 | 01D0 | 69 |
| 01B8 | 14 | 01D1 | 81 |
| 01B9 | 5D | 01D2 | 07 |
| 01BA | 13 | 01D3 | 03 |
| 01BB | 59 | 01D4 | 5D |
| 01BC | 13 | 01D5 | 79 |
| 01BD | 13 | 01D6 | 8E |
| 01BE | C9 | 01D7 | 16 |
| 01BF | 59 | 01D8 | 5E |
| 01C0 | 41 | 01D9 | 41 |
| 01C1 | F8 | 01DA | 25 |
| 01C2 | 5E | 01DB | 04 |
| 01DC | 20 | 01EE | 00 |
| 01DD | 45 | 01EF | 38 |
| 01DE | 81 | 01F0 | 29 |
| 01DF | 05 | 01F1 | 00 |
| 01E0 | 74 | 01F2 | 37 |
| 01E1 | 50 | 01F3 | 29 |
| 01E2 | 20 | 01F4 | 00 |
| 01E3 | AF | 01F5 | 48 |
| 01E4 | C3 | 01F6 | 29 |
| 01E5 | 90 | 01F7 | 00 |
| 01E6 | 2A | 01F8 | A2 |
| 01E7 | FF | 01F9 | 29 |
| 01E8 | FF | 01FA | 00 |
| 01E9 | FF | 01FB | C9 |
| 01EA | FF | 01FC | 29 |
| 01EB | FF | 01FD | 01 |
| 01EX | FF | 01FE | 84 |
| 01ED | 29 | 01FF | FF |

TABLE 2

| ADDRESS | CODE | ADDRESS | CODE |
| --- | --- | --- | --- |
| 0200 | 29 | 02ED | 5D |
| 0201 | 02 | 02EE | 25 |
| 0202 | DD | 02EF | 05 |
| 0203 | 29 | 02F0 | 81 |
| 0204 | 03 | 02F1 | 1C |
| 0205 | 26 | 02F2 | 70 |
| 0206 | 29 | 02F3 | 5E |
| 0207 | 02 | 02F4 | 5C |
| 0208 | 7A | 02F5 | 6C |
| 0209 | FF | 02F6 | 39 |
| 020A | FF | 02F7 | 94 |
| 020B | FF | 02F8 | EF |
| 020C | FF | 02F9 | 69 |
| 020D | FF | 02FA | 20 |
| 020E | FF | 02FB | 67 |
| 020F | FF | 02FC | DC |
| 0210 | 90 | 02FD | 5E |
| 0211 | 11 | 02FE | 14 |
| 0212 | 20 | 02FF | CC |
| 0213 | 20 | 0300 | 5D |
| 0214 | C1 | 0301 | 25 |
| 0215 | 51 | 0302 | 01 |
| 0216 | 13 | 0303 | 81 |
| 0217 | 13 | 0304 | 09 |
| 0218 | 13 | 0305 | 4C |
| 0219 | 59 | 0306 | 25 |
| 021A | 41 | 0307 | 03 |
| 021B | 14 | 0308 | 81 |
| 021C | 12 | 0309 | 04 |
| 021D | 24 | 030A | 70 |
| 021E | 08 | 030B | 5E |
| 021F | 50 | 030C | 5D |
| 0220 | 20 | 030D | 4C |
| 0221 | 52 | 030E | F8 |
| 0222 | C9 | 030F | 5C |
| 0223 | 51 | 0310 | 6F |

TABLE 2-continued

| ADDRESS | CODE | ADDRESS | CODE | ADDRESS | CODE | ADDRESS | CODE |
|---|---|---|---|---|---|---|---|
| 0224 | 40 | 0311 | 4C | 0275 | 14 | 0362 | 52 |
| 0225 | 19 | 0312 | 21 | 0276 | 5D | 0363 | 70 |
| 0226 | 13 | 0313 | 01 | 0277 | 49 | 0364 | C0 |
| 0227 | 13 | 0314 | CB | 0278 | F8 | 0365 | 91 |
| 0228 | 50 | 0315 | 21 | 0279 | 5C | 0366 | 03 |
| 0229 | 70 | 0316 | 1F | 027A | 7F | 0367 | 24 |
| 022A | C2 | 0317 | 25 | 027B | 53 | 0368 | 66 |
| 022B | 81 | 0318 | 1C | 027C | A1 | 0369 | D1 |
| 022C | 04 | 0319 | 20 | 027D | 22 | 036A | 25 |
| 022D | 70 | 031A | F3 | 027E | 40 | 036B | 01 |
| 022E | 90 | 031B | 91 | 027F | B1 | 036C | 92 |
| 022F | 07 | 031C | 05 | 0280 | 28 | 036D | 03 |
| 0230 | 25 | 031D | 28 | 0281 | 02 | 036E | 20 |
| 0231 | 20 | 031E | 02 | 0282 | 9C | 036F | 79 |
| 0232 | 81 | 031F | 9C | 0283 | 00 | 0370 | 25 |
| 0233 | 03 | 0320 | 03 | 0284 | 25 | 0371 | 79 |
| 0234 | 20 | 0321 | 05 | 0285 | C9 | 0372 | 81 |
| 0235 | 20 | 0322 | 71 | 0286 | 91 | 0373 | 02 |
| 0236 | 52 | 0323 | 04 | 0287 | 12 | 0374 | 72 |
| 0237 | 41 | 0324 | 1B | 0288 | 84 | 0375 | 51 |
| 0238 | 14 | 0325 | 0C | 0289 | 04 | 0376 | 29 |
| 0239 | 12 | 0326 | 4B | 028A | 29 | 0377 | 01 |
| 023A | 12 | 0327 | F8 | 028B | 01 | 0378 | FC |
| 023B | C0 | 0328 | 06 | 028C | ED | 0379 | 40 |
| 023C | 50 | 0329 | 25 | 028D | 45 | 037A | 13 |
| 023D | 41 | 032A | 09 | 028E | 06 | 037B | 13 |
| 023E | 13 | 032B | 81 | 028F | 70 | 037C | C2 |
| 023F | 13 | 032C | 62 | 0290 | 57 | 037D | 81 |
| 0240 | C2 | 032D | 03 | 0291 | 20 | 037E | 05 |
| 0241 | 59 | 032E | 6C | 2092 | FD | 037F | 20 |
| 0242 | 40 | 032F | 5C | 0293 | 54 | 0380 | 1C |
| 0243 | 19 | 0330 | 6F | 2094 | 03 | 0381 | 90 |
| 0244 | 18 | 0331 | 5E | 0295 | 67 | 0382 | E0 |
| 0245 | B1 | 0332 | 20 | 0296 | 6F | 0383 | 25 |
| 0246 | 01 | 0333 | E2 | 0297 | 5E | 0384 | 1C |
| 0247 | 25 | 0334 | 5D | 0298 | 5C | 0385 | 81 |
| 0248 | 70 | 0335 | 02 | 0299 | 29 | 0386 | 04 |
| 0249 | 84 | 0336 | 13 | 029A | 01 | 0387 | 70 |
| 024A | 08 | 0337 | 18 | 029B | F0 | 0388 | 90 |
| 024B | 25 | 0338 | 24 | 029C | 2A | 0389 | D9 |
| 024C | 74 | 0339 | 16 | 029D | 03 | 038A | 52 |
| 024D | 84 | 033A | 25 | 029E | D0 | 038B | 41 |
| 024E | 04 | 033B | FE | 029F | 20 | 038C | 90 |
| 024F | 70 | 033C | 91 | 02A0 | 80 | 038D | DD |
| 0250 | 90 | 033D | 08 | 02A1 | B4 | 038E | 57 |
| 0251 | 02 | 033E | 02 | 02A2 | 65 | 038F | 77 |
| 0252 | 72 | 033F | 55 | 02A3 | 68 | 0390 | 56 |
| 0253 | C9 | 0340 | 20 | 02A4 | 74 | 0391 | 5C |
| 0254 | 18 | 0341 | D1 | 02A5 | 59 | 0392 | 29 |
| 0255 | B0 | 0342 | 5C | 02A6 | 7C | 0393 | 01 |
| 0256 | 01 | 0343 | 71 | 02A7 | 50 | 0394 | F6 |
| 0257 | 51 | 0344 | 04 | 02A8 | 16 | 03B0 | DF |
| 0258 | 67 | 0345 | 50 | 02A9 | B4 | 03B1 | CE |
| 0259 | 68 | 0346 | 66 | 02AA | CA | 03B2 | EF |
| 025A | 03 | 0347 | 6A | 02AB | B4 | 03B3 | DF |
| 025B | C2 | 0348 | 45 | 02AC | 39 | 03B4 | DF |
| 025C | 84 | 0349 | 24 | 02AD | 94 | 03B5 | CA |
| 025D | 1D | 034A | F5 | 02AE | FA | 03B6 | ED |
| 025E | 50 | 034B | 5C | 02AF | 0A | 03B7 | DF |
| 025F | 20 | 034C | 25 | 02B0 | 25 | 03B8 | FC |
| 0260 | FB | 034D | 02 | 02B1 | 34 | 03B9 | FE |
| 0261 | 5C | 034E | 84 | 02B2 | 94 | 03BA | F1 |
| 0262 | 81 | 034F | 11 | 02B3 | 0A | 03BB | FE |
| 0263 | 08 | 0350 | 91 | 02B4 | 67 | 03BC | F3 |
| 0264 | 20 | 0351 | 28 | 02B5 | 70 | 03BD | FA |
| 0265 | FD | 0352 | 47 | 02B6 | CC | 03BE | DF |
| 0266 | 5C | 0353 | C0 | 02B7 | 81 | 03BF | DF |
| 0267 | 40 | 0354 | 81 | 02B8 | 03 | 03C0 | C7 |
| 0268 | 18 | 0355 | 02 | 02B9 | 7A | 03C1 | FE |
| 0269 | 1F | 0356 | 79 | 02BA | 8E | 03C2 | DF |
| 026A | 50 | 0357 | 25 | 02BB | 66 | 03C3 | EB |
| 026B | 20 | 0358 | 09 | 02BC | 6E | 03C4 | FE |
| 026C | 67 | 0359 | 81 | 02BD | 4C | 03C5 | EC |
| 026D | 59 | 035A | 02 | 02BE | 24 | 03C6 | EB |
| 026E | 70 | 035B | 70 | 02BF | 30 | 03C7 | F0 |
| 026F | D9 | 035C | 57 | 02C0 | 18 | 03C8 | DF |
| 0270 | 30 | 035D | 29 | 02C1 | B4 | 03C9 | DF |
| 0271 | 94 | 035E | 01 | 02C2 | CA | 03CA | C7 |
| 0272 | FD | 035F | F9 | 02C3 | B4 | 03CB | FE |
| 0273 | 69 | 0360 | 20 | 02C4 | 0A | 03CC | DF |
| 0274 | 59 | 0361 | 10 | 02C5 | 1F | 03CD | DF |

TABLE 2-continued

| ADDRESS | CODE | ADDRESS | CODE |
| --- | --- | --- | --- |
| 02C6 | 0B | 03CE | DF |
| 02C7 | 30 | 03CF | DF |
| 02C8 | 94 | 03D0 | DF |
| 02C9 | F4 | 03D1 | DF |
| 02CA | CA | 03D2 | DF |
| 02CB | 84 | 03D3 | DF |
| 02CC | 07 | 03D4 | FF |
| 02CD | 7B | 03D5 | FF |
| 02CE | 59 | 03D6 | FF |
| 02CF | 75 | 03D7 | FF |
| 02D0 | 50 | 03D8 | FF |
| 02D1 | 90 | 03D9 | FF |
| 02D2 | D6 | 03DA | FF |
| 02D3 | B4 | 03DB | FF |
| 02D4 | 33 | 03DC | FF |
| 02D5 | 81 | 03DD | FF |
| 02D6 | 06 | 03DE | FF |
| 02D7 | 53 | 03DF | FF |
| 02D8 | A1 | 03E0 | 05 |
| 02D9 | 21 | 03E1 | 07 |
| 02DA | BF | 03E2 | 14 |
| 02DB | B1 | 03E3 | 00 |
| 02DC | 1C | 03E4 | 01 |
| 02DD | 34 | 03E5 | 03 |
| 02DE | 94 | 03E6 | 05 |
| 02DF | 41 | 03E7 | 07 |
| 02E0 | 72 | 03E8 | 07 |
| 02E1 | 59 | 03E9 | 07 |
| 02E2 | 20 | 03EA | D1 |
| 02E3 | FE | 03EB | D2 |
| 02E4 | 54 | 03EC | D3 |
| 02E5 | 65 | 03ED | D4 |
| 02E6 | 6F | 03EE | D5 |
| 02E7 | 20 | 03EF | D6 |
| 02E8 | 67 | 03F0 | D7 |
| 02E9 | DC | 03F1 | D8 |
| 02EA | 5E | 03F2 | D9 |
| 02EB | 14 | 03F3 | DC |
| 02EC | CC | | |

The above tables contain, in coded form, one possible sequence of elementary operations for performing, via the microprocessor system indicated, the functions shown in the block diagrams and foregoing description.

Figure 5:
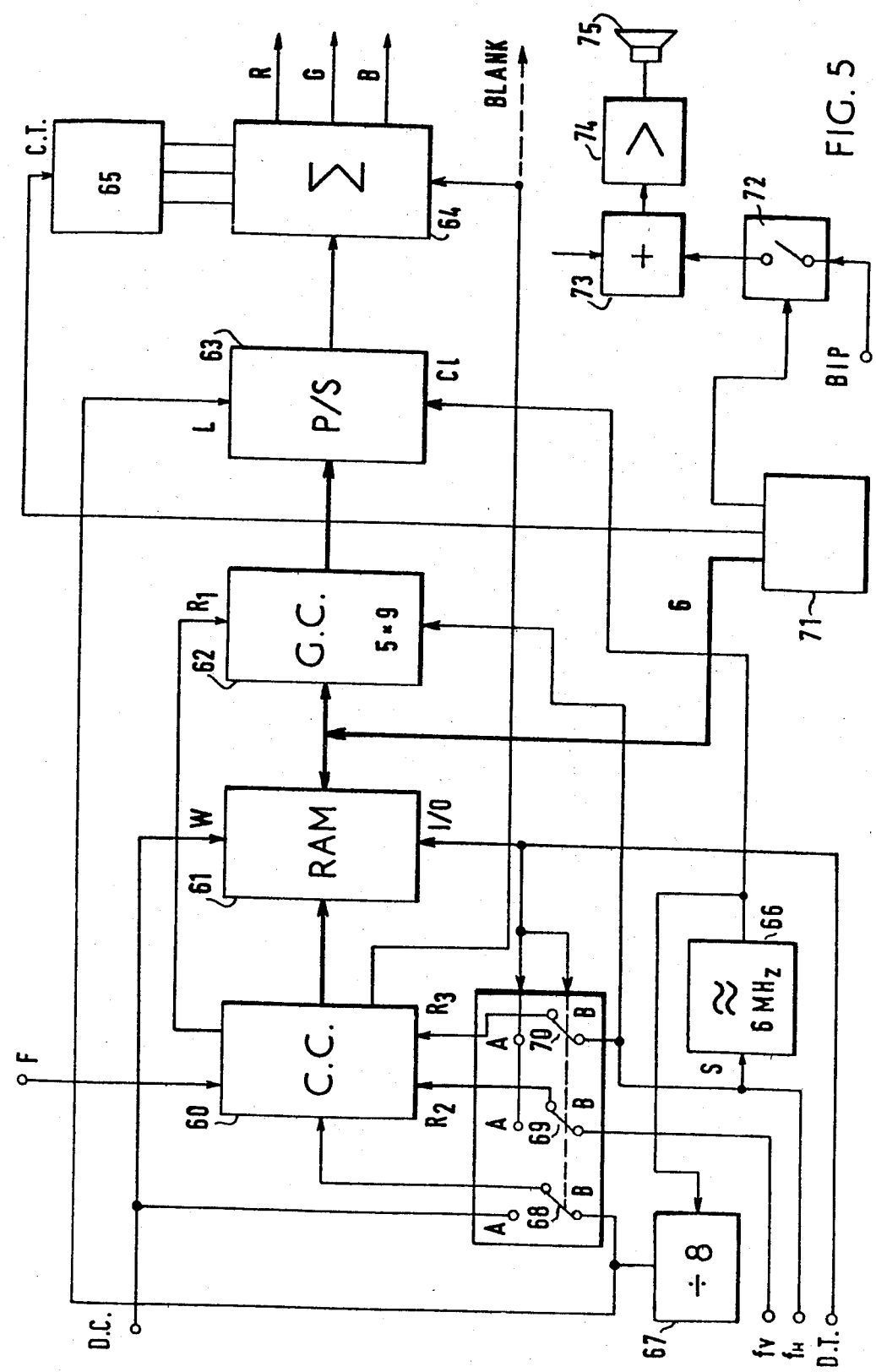
FIGS. 5 and 6 show a number of FIG. 1 circuits in greater detail.

FIG. 5 shows a more detailed representation of the block diagram of character generator 16 in FIG. 1.

Number 60 in FIG. 5 indicates a character count circuit for supplying the addresses to character memory 61. This has a 48×6 format for containing the 48 characters transmitted periodically by processing unit 11.

The six INPUT/OUTPUT terminals of the said memory are connected to six output terminals of PORT 71 of processing unit 11. These are also connected to six inputs of character ROM 62.

This may be a Fairchild 3258 type, for memorizing 64 characters for each of which it supplies an image consisting of a 5×7 point matrix. Each character is separated vertically from the next by two lines of blanks.

A built-in counter, which receives a clock signal with horizontal scanning frequency FH from the television circuits and a reset signal R1 from circuit 60, scans the following point lines of the said matrix.

The five outputs of the said ROM 62 are connected to a parallel-series converter circuit 63 which transforms the 5 signals received from the 5 outputs into a series signal. It also adds a suitable number of blanks (e.g. 3) on to the end of the 5 signals to separate the characters horizontally.

Circuit 63 receives a clock signal from oscillator circuit 66 the frequency of which determines the width of each of the characters displayed on the screen. It also receives a LOAD signal "L" for each character (every 5+3=8 clock cycles in the example shown) from divider circuit 67 which, in turn, receives the clock signal from oscillator circuit 66. The signal thus received at the output of converter 63 is sent to combiner circuit 64 consisting of known logic elements (e.g. three 2-input AND gates each with a first input connected to the output of circuit 63 and a second connected to one of the outputs of circuit 65) which sends the said signal to one or more of its three outputs, marked R, G and B in the Figure, in response to the same number of control signals supplied by control circuit 65. The said outputs R, G and B are connected, in the known way, to the amplifier circuits of the color signals on the set so that the signals supplied by circuit 64 are added to the video ones of the received television signal.

Depending on the instructions received from circuit 65, it is possible to obtain the indications in any one of the three primary color combinations.

In FIG. 5, the control circuit 65 receives a control signal from an output of circuit 71 (port 4 of unit 11 in FIG. 1) so that the indications are displayed in green when the system is set to the first keyboard and yellow when it is set to the second.

Numbers 68, 69 and 70 indicate three switch circuits, similar to one another, controlled in parallel by a memory control signal DT supplied by a bit of port 1 of processing unit 11 in FIG. 1. Depending on the DT signal, these three switch circuits enable the FIG. 5 circuits to be set so as to load the data in memory 61 when the DT signal is present (high) and, vice versa, to set the same circuits for transmitting the data from the said memory to outputs R, G and B when the DT signal is absent (low) or when unit 11 is not transmitting characters to memory 61 (for display updating). To do this, when the DT signal is present, switches 68, 69 and 70 are positioned as shown by letter A in FIG. 5. This causes a reset pulse to be applied to terminals R2 and R3 of count circuit 60 and memory 61 is set to INPUT by the same DT signal applied to the input-output I/O control terminal.

Via switch circuit 68, count circuit 60 receives clock pulses DC from an output terminal of processing unit 11 of FIG. 1 (port 4). The same DC signal is also sent to the write control input "W" of memory 61.

In this way, for each clock pulse it receives, counter 60 supplies RAM memory 61 with addresses from 0 to 47. At the same time, unit 11 supplies the 48 signals (at port 4) received at the data input of the same memory so that they are memorized in the corresponding cells as a result of the "W" pulses.

When the DT signal is absent, on the other hand, (switches in position B), character counter 60 receives clock signals from circuit 66 via divider 67, reset signals with vertical scanning frequency fr at terminal R2, reset signals with horizontal scanning frequency FH at terminal R3 and a format-change signal "F" (controlled by a timer in processing unit 11, from processing unit 11. In this way, it supplies memory 61 with suitable addresses for arranging the 48 display characters in three 16-character lines, should signal "F" be present, or else it supplies the memory with only the first sixteen addresses for displaying a single 16-character line when signal "F" is absent. Alteernatively, character counter 60 can cut the size of the three sixteen character lines in half when the signal "F" is absent. Counter 60 also supplies combiner circuit 64 with a disabling circuit for disactivating it during the remaining television picture time. In this way, only a certain part of the screen is displayed, e.g. the top left-hand corner. If needed, the same disabling signal can be used for supplying a blank signal at an appropriate point in the television video amplification chain so as to blacken the background of the display to make the characters more visible.

A further output of circuit 71 (port 4 of unit 11) controls a switch, 72, between a BIP signal (which can be picked up at an appropriate point on the circuit, e.g. at the output of divider 7 of FIG. 1) and a first input of an adding circuit, 73, whose second input receives the audio B.F. signal of the received television signal picked up downstream from the manual volume adjuster. The output of the adding circuit is connected to the input of the B.F. amplifier, 74, on the set which pilots the loudspeaker 75.

In this way, under given circumstances, the processing unit 11 can control the sounding of an alarm for warning the user. The said circumstances may be:

(1) When the "M" memory key is pressed. The alarm reminds the user that the key has been pressed so as to prevent him from altering the content of the memory by mistake;

(2) when an unperformable instruction is given (e.g. the number of a non-existent channel or time) etc.

(3) when the maximum allowable limits have been reached for certain adjustments such as fine tuning corrections.

Figure 6:
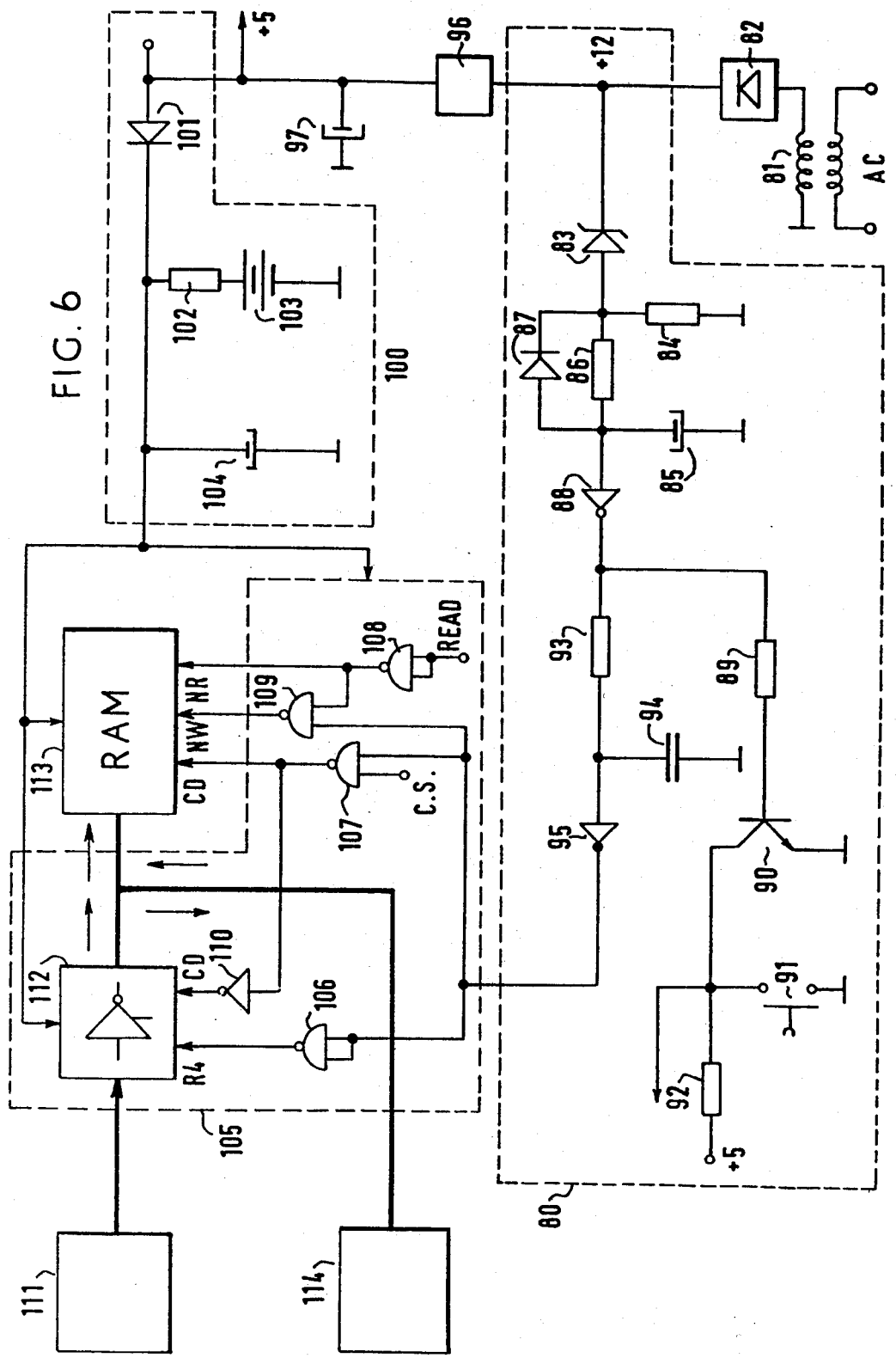

FIG. 6 gives a more detailed view of parts of circuits 12, 13, 14 and 15 in FIG. 1 showing memorization of the channels in the outside memory and maintenance of data during temporary power cuts. The said circuits 12, 13, 14 and 15 roughly correspond to the blocks marked 113, 100, 105 and 80 in FIG. 6.

Block 80 comprises a Zener diode, 83, connected between a +12 output of a supply circuit ("AC" voltage input, transformer 81 and rectifier 82) and a grounded resistor 84. The signal present at the resistor terminals is sent to an integrator circuit consisting of resistor 86, diode 87 and condenser 85.

The signal made available here, and inverted by inverter 88, is sent to inverter circuit 95 via integrator assembly consisting of resistor 93 and condenser 94, and also to the base of common-emitter transistor 90 via coupling resistor 89. The collector of transistor 90 is connected to a +5 supply voltage through resistor 92 and grounded through push-button switch 91 and supplies a reset signal to processing unit 11 (FIG. 1).

The +12 voltage is also supplied to the input of a stabilizer circuit 96 at the output of which, filtered by condenser 97, is made available the +5 supply voltage for supplying other circuits not shown in the Figure. The output of inverter 95 is connected to a first input of NAND gates 107 and 109 and to both inputs of NAND gate 106 which acts as an inverter. The output of the said gate 106 is connected to a reset input R4 of separator circuit 112 which receives the output signal of gate 107 at its disabling input C.D. via inverter circuit 110. Gate 107 receives a conditioning signal C.S. from processing unit 11 of FIG. 1 at its second input. The output of gate 107 is also connected to a disactivating input C.D. of memory 113.

A READ signal from processing unit 11 of FIG. 1 is sent via NAND gate 108, which acts as an inverter, to the read disabling "NR" input of memory 113. This input is also connected to a second input of gate 109 the output of which is connected to a write disabling "NW" input of the same memory 113.

The +5 voltage is also supplied to the anode of diode 101 at the cathode of which is connected a condenser, 104, the second terminal of which is grounded. Resistor 102 and 3 Volt battery 103, connected in series, are also connected parallel to condenser 104. The voltage available at the terminals of condenser 104 supplies memory 113, separator 112 and the 4 gates 106, 107, 108 and 109 contained in a single semiconductor body (CHIP).

Separator 112 has 5 inputs connected to 5 outputs of control circuit 111 (keyboard or remote-control receiver) and 5 outputs connected to 5 terminals of circuit 114 (port 5 of processing unit 11 in FIG. 1).

The same 5 outputs are also connected to 5 address inputs of memory 113.

The circuit described above operates as follows:

The function of block 100 is to generate a permanent supply voltage to keep memory 113 activated. In the event of a power cut, battery 103 supplies sufficient current to maintain the data in the memory through resistor 102. Vice versa, when power is being supplied from the mains, the +5 voltage is supplied to the memory via diode 101 and, at the same time, the battery is recharged slightly through resistor 102.

By means of Zener diode 83 and the integrator circuit comprising elements 85, 86 and 87, block 80 supplies a signal, at the output of inverter 95, after the +5 voltage, when the power supply is restored, and in advance of the said voltage when the power supply is cut off. In this way, the signals supplied by processing unit 11 to memory 113 cannot reach the memory during a power cut or during transient states.

Under the above conditions, gates 107, 108 and 109 are conditioned so as to protect memory 113 whereas gates 106 and 110 force separator 112 to supply a series of zeros at the output to prevent the memory from receiving chaotic address signals.

Block 80 also supplies, at the output of transistor 90, a signal similar to the one supplied by inverter 95 to keep processing unit 11 inactive during transient states and thus prevent uncontrolled operation. Push-button 91, however, enables a reset signal to be supplied manually to the said unit to commence the operation sequence from a preset point.

Figure 7:
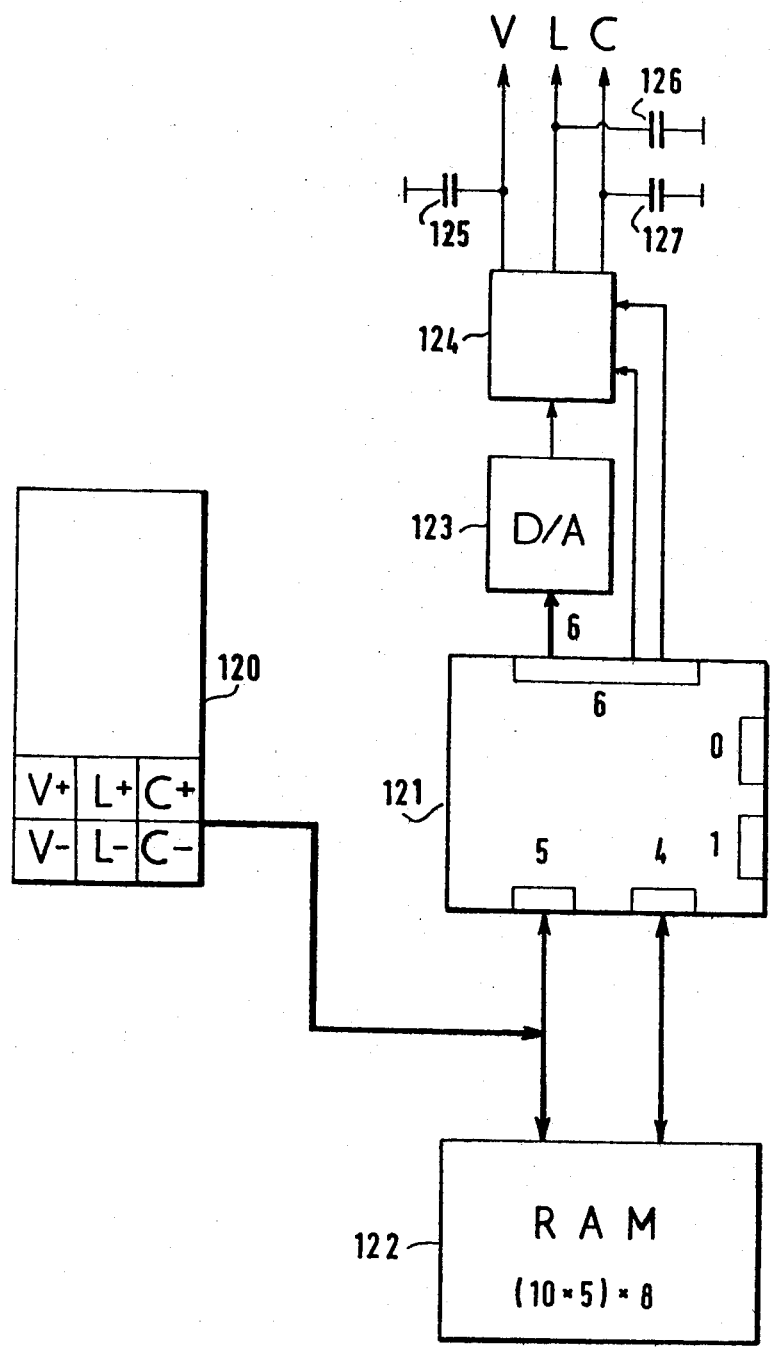
FIG. 7 shows the block diagram of a perfected version of the circuit of FIG. 1—only the differing features are shown.

FIG. 7 shows a possible variation of one part of the circuit shown in FIG. 1. FIG. 7 only illustrates the parts which differ from FIG. 1 or which are connected differently.

Number 120 in FIG. 7 indicates a control keyboard which, besides the keys shown in FIG. 1 and not repeated here, comprises 6 keys marked "V+", "V−", "L+", "L−", C+" and "C−". The outputs of the said keyboard are connected to a group of input-output terminals 5 of processing unit 121 which is essentially the same as unit 11 in FIG. 1 from which it differs, among other things, by the provision of a further group of output terminals (ports) 6.

Six terminals of the said group are connected to six inputs of a digital/analogue converter 123 of the known type (e.g. consisting of a known network of R/2R resistors). The analogue output of the said converter is supplied to a switch circuit 124 with three outputs marked V, L and C in the Figure which are connected to three storage condensers 125, 126 and 127 respectively. Switch 124 also has two control input terminals connected to the remaining two output terminals of port 6 of unit 121 which receive the respective control signals for forwarding the analogue signal to one or other of condensers 125, 126 or 127.

The group of terminals or port 4 is connected to 8 input/output terminals of a RAM memory circuit 122. This replaces memory 12 of FIG. 1 from which it differs by the number of 8-bit cells (10×5 instead of 10×2). This memory also receives six address bits (instead of 5) from six output terminals (port 5) of unit 121.

The FIG. 7 circuit operates as follows:

When one of the six keys mentioned above is pressed (e.g. key "V+"), unit 121 supplies the character generating circuit with a combination of symbols which may be:

VVVVVVVV.....
LLLLLL.......
CCCCCCCCCC..

The line of symbols corresponding to the pressed key (V, L, C) is displayed with a different color from the rest. The number of characters per line is proportional to the corresponding analogue signal level (V, L, C) at that time. Whenever one of the + keys is pressed, the corresponding analogue level is increased 1/64 of maximum value. When an operation involving memorization is performed (e.g. whenever "KEY" operation mode is adjusted or the "M" key pressed), processing unit 121 transmits the relative data in digital form to memory 122 and has it memorized with much the same procedure already described and shown in FIG. 3. This means the data memory 122 is called upon to memorize for each of the 10 "KEYS" is of 5 types: channel, tuning, volume, brightness and color. For the sake of uniformity; the memory accepts 8-bit data whereas, the analogue adjustments, 6 bits, (64 levels) are more than enough so two bits are ignored.

Other ways exist of displaying analogue levels on the television screen using the character generator and circuit arrangement described in the present invention. Besides the one described above, the display could show any one of the following:

V*******<
L*****
C**********
or:
VOLUME 40?
BRIGHTNESS 30
COLOR 50
or:
V+++++
L
C-

In the first, the number of asterisks is proportional to the relative analogue signal level and the adjustment being made indicated by the symbol ">". In the second, the level is indicated by the number to the side of the adjustment item while the adjustment being made is indicated by the question mark. In the third, the number of "+" (or "−") signs is proportional to the increase (or decrease) made to the preset nominal level. Of course, the preselected, memorized levels are preserved in memory 122, even in the event of a power outage, thanks to the precautions already described which also apply to the embodiment of FIG. 7.

It may prove useful to apply the sound alarm described in FIG. 5 for analogue adjustments too, for example, when the maximum level is reached.

The advantages of the present invention will be clear from the foregoing description. However, a number of variations can be made. For example, in the description, it was supposed a particular type of 8-bit microprocessor system was used with a separate CPU and ROM. It is possible, and even convenient, to use other types of microprocessors with a higher number of internal RAM registers (e.g. 128) or a so-called monochip containing an internal RAM and timer circuit, besides the ROM, or a 16-bit microprocessor.

It may even prove useful to fit the receiver with a remote-control. In this case, a keyboard similar to the one described is combined on the portable transmitter part of the remote-control system. A further variation, to avoid duplicating the control keyboard, could be to provide accommodation in the receiver housing with electric contacts in which to connect the transmitter part for operating the local control.

Many other variations can be made without, however, departing from the scope of the present invention.

For example, besides the key arrangement in FIG. 1 for controlling channel selection or FIG. 7 for controlling analogue levels (V, L, C), a number of different combinations can be used even using other control components different from keys or push-buttons.

I claim:

1. Apparatus for use with a television receiver, said apparatus comprising:

a power circuit for converting a mains power supply voltage to a reduced voltage which is applied as a power signal to several components of said television receiver, said power circuit generating said reduced voltage shortly after said mains power supply voltage is applied thereto and maintaining said reduced voltage until shortly after said mains power supply voltage is removed therefrom;

a read/write memory for storing information relating to the operating parameters of said television receiver, said memory having data terminals, address terminals, and one or more control terminals for controlling operation of said memory;

a control circuit for controlling said operating parameters of said television receiver as a function of said information stored in said memory and as a function of data signals applied thereto, said control circuit changing the values of said information stored in said memory by applying control signals to said data and address terminals of said memory in response to specific data signal applied to said control circuit;

first means for generating a disable signal responsive to an interruption of said mains power supply voltage, said disable signal being generated before said reduced voltage is cut off in response to the removal of said mains power supply voltage from said power circuit, said disable signal continuing until after said reduced voltage is again generated by said power circuit in response to the reapplication of said mains power supply voltage to said power circuit;

second means responsive to said disable signal for supplying a series of fixed signals to at least one of said data and address terminals of said memory; and third means responsive to said disable signal for applying to at least one of said control terminals of said memory an appropriate signal for preventing said information stored in said memory from being changed during the period in which said disable signal is generated.

2. Apparatus according to claim 1, wherein said series of fixed signals is supplied to said address input terminals of said memory.

3. Apparatus according to claim 1, wherein said series of fixed signals is a series of zeroes.

4. Apparatus according to claim 1, wherein said control circuit for controlling said operating parameters of said television receiver comprises a processing unit, and wherein fourth means are provided for keeping said processing unit inactive during the period in which said disable signal is generated.

5. Apparatus according to claim 1, further including an emergency power supply comprising:
   a battery;
   a resistor coupling said battery to said memory; and
   a diode for normally coupling said reduced voltage to said memory, the location of said diode being such that said reduced voltage normally charges said battery and such that said battery applies power to said memory when said reduced voltage is cut off.

* * * * *